United States Patent [19]
Callahan

[11] Patent Number: 6,167,543
[45] Date of Patent: Dec. 26, 2000

[54] MEMORY TEST MODE CIRCUIT

[75] Inventor: John M. Callahan, San Ramon, Calif.

[73] Assignee: NanoAmp Solutions, Inc., San Jose, Calif.

[21] Appl. No.: 09/063,819

[22] Filed: Apr. 21, 1998

[51] Int. Cl.[7] .................................................. G11C 29/00
[52] U.S. Cl. ........................................... 714/721; 305/201
[58] Field of Search .................................... 714/718, 721; 365/201

[56] References Cited

U.S. PATENT DOCUMENTS

| 5,727,001 | 3/1998 | Loughmiller | 714/744 |
| 5,847,595 | 12/1998 | Kano et al. | 327/530 |

Primary Examiner—Albert De Cady
Assistant Examiner—Esaw Abraham
Attorney, Agent, or Firm—Patrick T. King

[57] ABSTRACT

A memory-test-mode detection circuit for an integrated circuit uses one or more of the input pins of an integrated circuit to detect at least one non-standard signal level. To avoid false triggering several other non-standard logic levels can also be used with some of the other input pins. Each of the non-standard signal levels are detected by a separate signal level detection circuit. A predetermined combination of input signals then provides a control signal which sets the integrated-circuit into a predetermined test mode. A non-standard Vcc/2 signal level is detected by determining that it is above a predetermined low threshold level of ¼ Vcc and below a predetermined high threshold level of ¾ Vcc. Additional non-standard input signal levels which are close to Vcc and Vss are also used. A chip enable (CEX) signal is used to enable the signal level detection circuit when a chip is enabled. A delay circuit is serially coupled to the output terminal of the signal level detection circuit to require the input signals to have a predetermined minimum time duration.

10 Claims, 2 Drawing Sheets

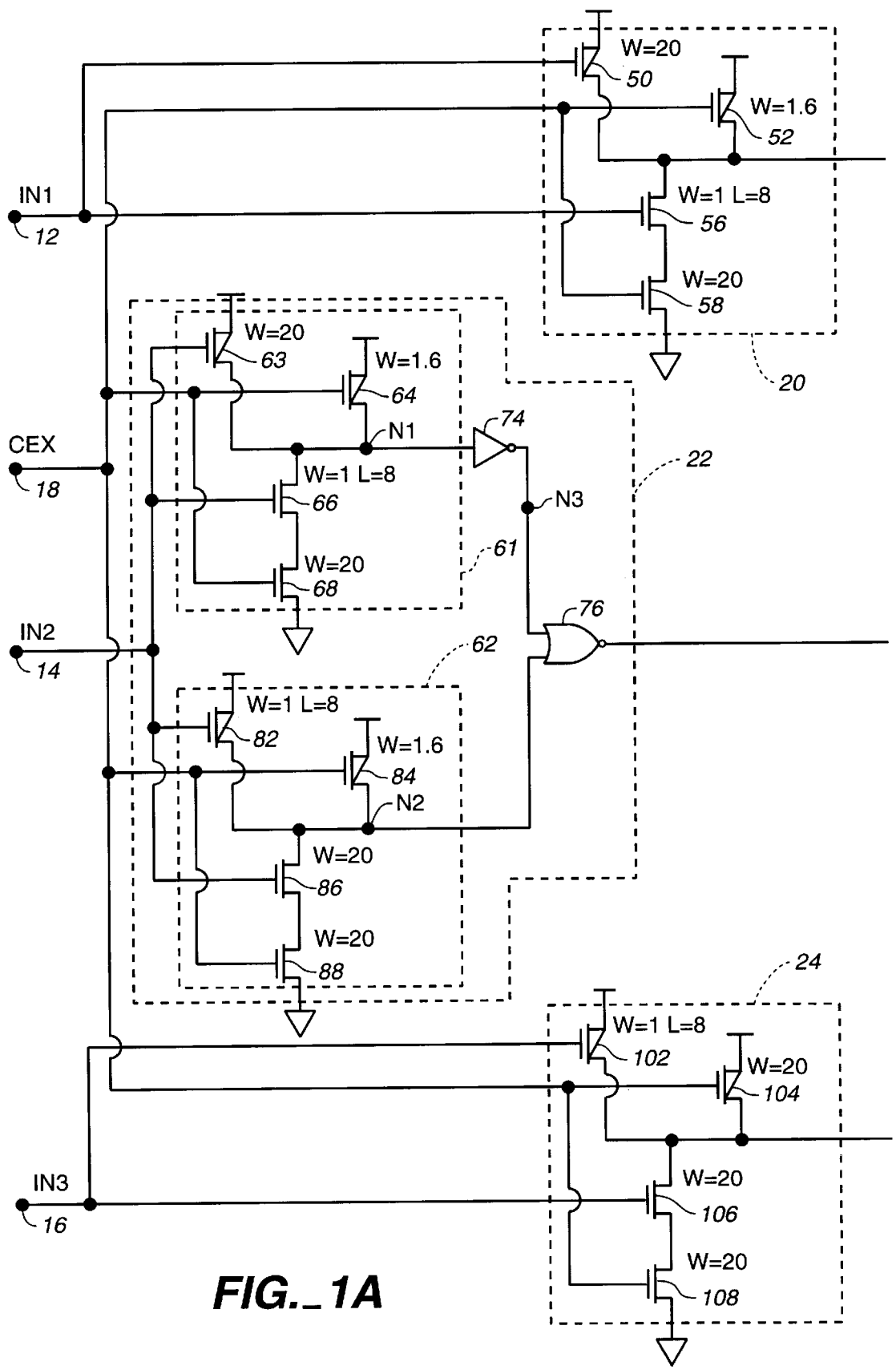
FIG._1A

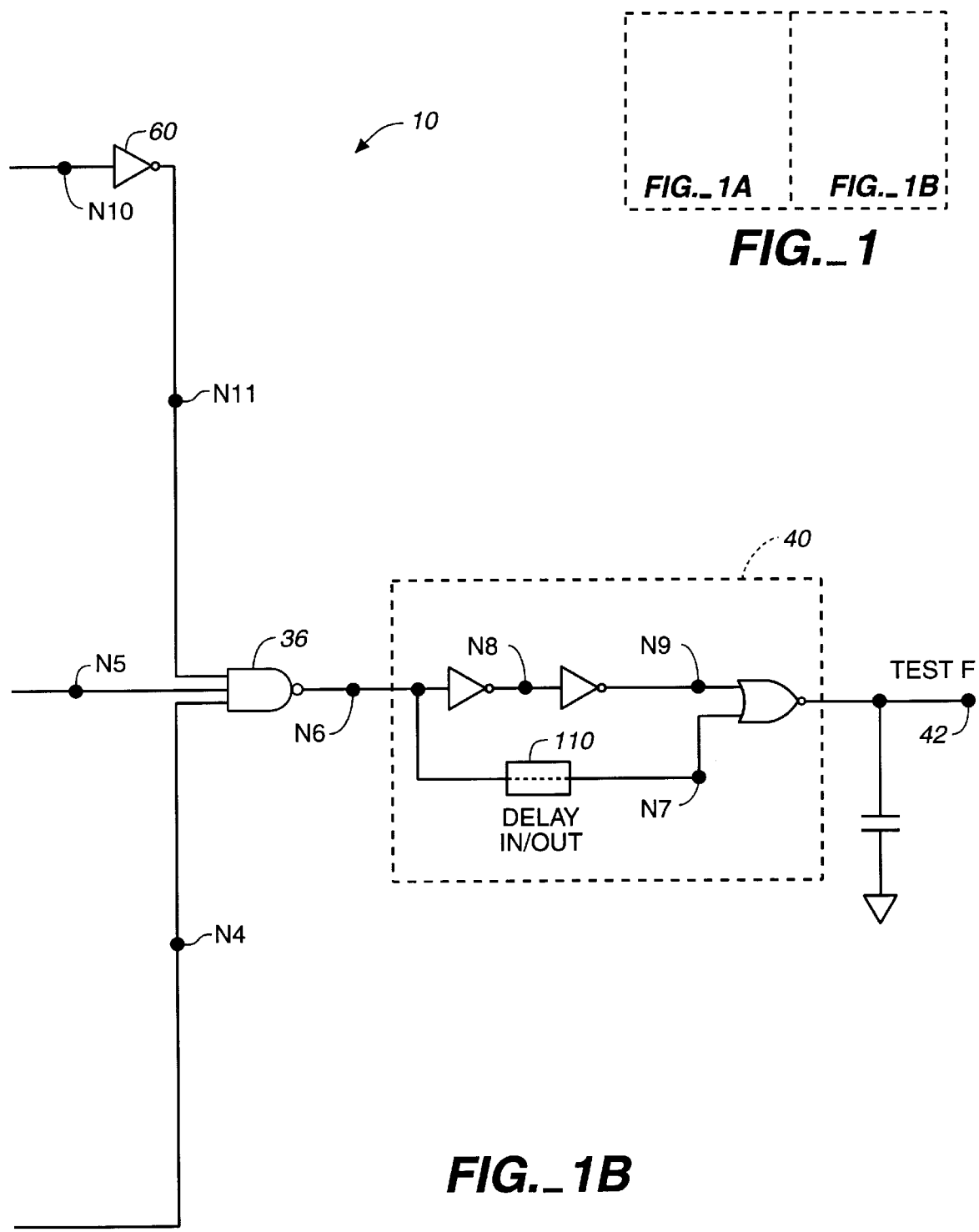
FIG._1
FIG._1B

MEMORY TEST MODE CIRCUIT

BACKGROUND OF THE INVENTION

1. Field of the Invention

This invention relates to memory integrated-circuits and, more particularly, to a circuit for operating the memory integrated-circuit in a test mode.

2. Prior Art

A memory integrated-circuit is placed into a test mode so that various parameters of the memory integrated-circuit can be monitored. A number of different performance parameters can be monitored and can include anything that a design engineer thinks is important and needs to be monitored.

One way to put a memory integrated-circuit into a test mode is to provide a forbidden or don't-care combination of conventional input signal levels at various input terminals. This forbidden or don't-care combination of conventional input signal levels is then detected inside the integrated-circuit and the integrated-circuit goes into test mode. A difficulty is that some memory chips do not have a forbidden or don't-care combination of conventional input signal levels.

One example of a manufacturer being unable to use a don't-care package pin for detection of a test mode command for a 1 Meg RAM integrated-circuit is that a customer could create his test board to use the trace and socket associated with this don't-care pin for another purpose in order to save circuit-board space so that the don't-care pin cannot be used for detection of a test mode.

Another example of a manufacturer being unable to use a don't-care package pin for detection of a test mode command for an integrated-circuit is that, when a RAM is being written to, the output enable (OE) pin is in a don't-care state. This is because the write condition automatically shuts off the outputs which is normally a function of the OE signal. On the face of it, it would seem that the OE being high and the write condition being active would be a good state to use for test mode detection. But an astute customer could take advantage of OE being a don't-care during the RAM write condition to use the OE trace on the circuit board for another purpose. This would preclude this avenue for test mode detection.

These two examples indicate that there are cases where there is no combination of conventional signal inputs which can be detected to put an integrated circuit into test mode.

Consequently, a need exists for a circuit which is able to get around this limitation and to be able to put an integrated-circuit into test mode even though there is no use of forbidden or don't-care combinations of conventional input signal levels.

SUMMARY OF THE INVENTION

It is therefore an object of the invention to provide a memory test mode circuit which is able to put an integrated-circuit into test mode without the use of forbidden or don't-care combinations of conventional input signal levels.

In accordance with this and other objects of the invention, a memory-test-mode detection circuit for an integrated circuit is provided which includes a signal level detection circuit. The signal level detection circuit uses one or more of the input pins of an integrated circuit to detect at least one signal which has a non-standard signal level. To avoid false triggering several other non-standard logic levels can also be used with some of the other input pins. Each of the non-standard signal levels are detected by a separate signal level detection circuit. A predetermined combination of input signals then provides a control signal which sets the integrated-circuit into a predetermined test mode.

One embodiment of the memory test mode detection circuit includes signal level detector circuit for determining that the non-standard Vcc/2 signal level is below a predetermined high threshold level and above a predetermined low threshold level, where the predetermined high threshold level is ¾ Vcc and where the predetermined low threshold voltage is ¼ Vcc. Additional input signal levels which are close to Vcc and Vss can also be used.

A chip enable (CEX) signal is coupled to another input signal node of the signal level detection circuit to enable the signal level detection circuit when a chip enable (CEX) signal is TRUE.

A delay circuit is serially coupled to the output terminal of the signal level detection circuit to require the output signal of the signal level detection circuit to have a predetermined minimum time duration to become active.

One embodiment of a memory test mode circuit includes a first input logic circuit having a first input signal node coupled to an input terminal of a first 2NAND, a second input logic circuit having a second input signal node coupled to an input terminal of a second 2NAND, a third input signal node coupled to an input terminal of a third 2NAND, a fourth input logic circuit having a fourth input signal node coupled to an input terminal of a fourth 2NAND, and a logic combining circuit for logically combining the output signal of the first, second, third and fourth logic circuits. A 2NAND is a 2-input inverting AND circuit.

BRIEF DESCRIPTION OF THE DRAWING

The accompanying drawing, which is incorporated in and form a part of this specification, illustrates embodiments of the invention and, together with the description, serves to explain the principles of the invention:

FIGS. 1, (1A, 1B) show a circuit diagram of a test mode detection circuit according to the invention.

DETAILED DESCRIPTION OF THE PREFERRED EMBODIMENTS

Reference will now be made in detail to the preferred embodiment of the invention, examples of which are illustrated in the accompanying drawing. While the invention will be described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

FIG. 1 is a circuit diagram of a preferred exemplary test-mode detection circuit 10, which is provided in a memory integrated-circuit, or chip. The test-mode detection circuit 10 detects certain predetermined input signal levels on certain predetermined input terminals, or pins, in order to place the associated memory integrated-circuit in a predetermined test mode. As an example of the invention, the exemplary test-mode detection circuit 10 uses three input signal terminals 12, 14, 16, which normally receive respective input signals IN1, IN2, IN3 to initiate a desired test sequence. A chip select (CEX) signal is provided at another input terminal 18 of the integrated-circuit. For normal operation the signal levels of IN1, IN2, IN3, and CEX swing between near Vcc for a logic HIGH level and near 0 volts for a logic LOW level. IN1, IN2, IN3 are, for example, memory address or data signals. Vcc is 3 volts and Vss is 0 volts, or ground, in this exemplary test-mode detection circuit 10.

As described herein below, the circuit of FIG. 1 operates to put the associated integrated-circuit in a predetermined test mode when IN1=Vcc, IN2=VCC/2, and IN3=Vss. A standard logic level 1 is a logic HIGH and a standard logic level 0 is a logic LOW.

Terminal 12 for IN1 and terminal 18 for CEX are connected to respective input terminals of a first detector circuit 20, which determines if a test-mode control signal at the IN1 terminal 12 is near the Vcc, or logic HIGH, level when CEX is also near the Vcc, or logic HIGH, level.

Terminal 14 for IN2 and terminal 18 for CEX are connected to respective input terminals of a second detector circuit 22, which determines if a test-mode control signal at the IN2 terminal 12 is between a ¾ Vcc level and a ¼ Vcc level when CEX is also near the Vcc, or logic HIGH, level.

Terminal 16 for IN3 and terminal 18 for CEX are connected to respective input terminals of a third detector circuit 24, which determines if a test-mode control signal at the IN3 terminal 16 is near the Vss, or logic LOW, level when CEX is also near the Vcc, or logic HIGH, level.

The output terminals Nil, N5, N4 of the respective first, second, and third detector circuits 20, 22, 24 are connected to the input terminals of a 3-input NAND gate 36. The output terminal N6 of the NAND gate 36 is connected to the input terminal of a pulse qualification circuit 40 which determines if a pulse at terminal N6 is valid and long enough to qualify as a valid control signal for placing the integrated-circuit in a test mode. The output terminal 42 of the pulse qualification circuit 40 provides a TESTF signal which is used to place the integrated-circuit into a predetermined test mode.

The First Detector Circuit

The detector circuit 20 includes first and second parallel-connected PMOS transistors 50, 52 which have their respective source terminals connected to a Vcc source and which have their drain terminals connected to an output terminal N10. The gate terminals of the PMOS transistor 50 is connected to IN1 terminal 12 and the gate terminal of the PMOS transistor 52 is connected to the CEX terminal 18. First and second NMOS transistors 56, 58 are connected in series between the output terminal N10 and Vss, or ground, as illustrated. The gate terminal of the NMOS transistor 56 is connected to the IN1 terminal and the gate terminal of the NMOS transistor 58 is connected to the CEX terminal 18. The output terminal N10 is connected to an input terminal of an inverter 60 which has an output terminal connected to an input terminal of the 3-input NAND gate 36. The detector circuit 20 provides a LOW output at terminal N10 when both IN1 and CEX are HIGH. Otherwise a HIGH level appears at terminal N10.

The Second Detector Circuit

The second detector circuit 22 includes two detector subcircuits 61, 62. The subcircuit 61 is similar to the detector circuit 20 and includes first and second parallel-connected PMOS transistors 63, 64 and first and second series-connected transistors 66, 68. An output node N1 is connected to an input terminal of an inverter 74 which has an output terminal N3 connected to an input terminal of a 2-input NOR gate 76.

The subcircuit 62 is also similar to the detector circuit 20 and includes first and second parallel-connected PMOS transistors 82, 84 and first and second series-connected transistors 86, 88. An output node N2 is connected to another input terminal of the 2-input NOR gate 76. The output terminal of the 2-input NOR gate 76 is connected to a second input terminal of the 3-input NAND gate 36.

The Third Detector Circuit

The third detector circuit 24 is similar to the detector circuit 20 and also includes first and second parallel-connected PMOS transistors 102, 104 and first and second series-connected transistors 106, 108. An output node N4 is connected to a third input terminal of the 3-input NAND gate 36.

The Chip Select (CEX) Input

The chip select signal (CEX) for the integrated circuit is used as a precaution to shut off all of the detector circuits 20, 22, 24 when the integrated-circuit is not selected by CEX. This is used because, when the integrated circuit is off, it is possible for the inputs signals IN1, IN2, IN3 at the high input impedances of the detector circuits to drift around, causing the input circuits to draw current when not desired. The CEX signal is in effect ANDed with all of the input signals to prevent triggering of the detectors by stray pickup signals when the CEX signal is off.

Need for Additional Detector Circuits

Integrated circuits are now being designed to use minimum current which means that the circuits are high-impedance circuits with input nodes which float and can pickup stray static charges from a printed circuit board on which they are mounted. When the integrated circuit is enabled by the CEX signal going high, the input signal IN2 at the high impedance node 14 could drift in voltage by picking up stray charges. A stray pickup voltage on the IN2 input terminal might put the integrated circuit into the test mode. As a precaution against false triggering of the test mode, the first and third detector circuits 20, 24, which are associated with the IN1 and IN3 signals, are also used to prevent this type of false triggering. It is unlikely that false triggering could occur if, for example, the requirement for placing the integrated circuit in the test mode is IN1=VCC, and IN2=VCC/2, and IN3=0.

The detector circuits 20, 61 driving respective nodes N10 and N1 are designed to trigger at just below Vcc. If the IN1 and IN2 input signals both drifted down below Vcc, both signals N10 and N1 would be triggered to a one level together and NC would go to zero, blocking the path from N5 through the 3-input NAND gate 36, preventing initiation of the test mode.

The same is true if IN1 was at VCC and IN2 and IN3 drifted above VSS. The circuitry driving nodes N2 and N4 could trigger but since the node N4 would go to zero, the test mode would be blocked. The circuitry driving nodes N2 and N4 trigger at levels just above VSS.

These different trigger points for the various detector circuits occur because of the different size ratios used with the various transistors in these circuits. The channel width (W) and channel length (L) in microns are shown for each transistor in FIG. 1. If a channel length is not shown, the length is 0.4. The W/L ratio of channel width to channel length determines the channel resistance of a transistor. Consequently, the trip levels for each input pin can be adjusted by setting the W/L ratio.

For discussion purposes, if the CEX transistors were removed from the circuitry driving N1, what is left is an inverter circuit with a low resistance pullup transistor 63 and a relatively high resistance pulldown transistor 66. For this circuit to trigger, the input signal IN2 would have to go very high or close to VCC.

The opposite is true for the circuitry driving node N2. If the CEX transistors were removed, what is left is an inverter circuit with a high resistance pullup transistor 82 and a relatively low resistance pulldown transistor 86. So the input signal IN2 would have to go very low or close to VSS for this circuit to trigger.

The NMOS transistors 58, 68, 88, 108 have their gate terminals connected to the CEX input terminal 18 and are resistive pulldown transistors which are used to insure that the various detector circuits are disabled when CEX is not active HIGH. The PMOS transistors 52, 64, 84, 104 also have their gate terminals connected to the CEX input terminal 18 and are resistive pullup transistors.

THE CONTROL SIGNAL DELAY CIRCUIT

The delay circuit 110 is used to solve the problem of IN1=Vcc and IN3=Vss while IN2 transitions very slowly from Vss to Vcc or from Vcc to Vss. There could be a period of time where node N6 would be low, putting the circuit into test mode. The cell delay prevents this. The delay circuit reacts to any transition on node N6 and immediately puts out a high pulse on node N7 that blocks the output control signal TESTF from going high. The pulse is approximately 1.5 microseconds wide and is designed, for example, to block the effects of an input taking 1.0 microseconds to transition.

The delay circuit includes an internal delay line which has both ends connected to the input terminals of an XOR circuit so that the XOR circuit puts out a pulse with a width equal to the time delay of the delay line. This pulse then sets a latch the output of which is sent to node N7 and to another internal delay line that is 1.5 microseconds wide. The output of this second delay line resets the latch and brings node N7 low again.

Lastly, the path from N2 to node N6 through the 2-input NOR gate 76 and the 3-input NAND gate 36 is designed to be very slow using low W/L ratio devices in order to filter out any fast moving signal edges which might be applied to IN2.

The circuit of FIG. 1 is used to put the associated integrated-circuit in a test mode when IN1=VCC, IN2=VCC/2, IN3=VSS, N10=VSS, N11=VCC, N1=VCC, N3=VSS, N2=VSS, N5=VCC, N4=VCC, N6=VSS, N9=VSS, N7=VSS, and TESTF=VCC, provided that the N6 pulse is longer in duration than a predetermined time period.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory-test-mode detection circuit for an integrated circuit, comprising a signal level detection circuit having an input signal terminal which is connected to one of the input terminals of the integrated circuit and at which is provided an input signal which has a non-standard signal level, which non-standard signal level is less than or equal to Vcc and that is greater than or equal to Vss, and which non-standard signal level is detected by the signal level detection circuit to provide a test mode output control signal at an output terminal of the signal level detection circuit for putting the integrated-circuit into a predetermined test mode; wherein the signal level detection circuit includes:

a first detector circuit for determining that the non-standard signal level is below a predetermined high threshold level that is less than or equal to Vcc; and a second detector circuit for determining that the non-standard signal level is above a predetermined low threshold level that is greater than or equal to Vss.

2. The memory test mode detection circuit of claim 1 wherein the predetermined high threshold level is ¾ Vcc and wherein the predetermined low threshold voltage is ¼ Vcc.

3. The memory test mode detection circuit of claim 1 wherein the signal level detection circuit is a 2NAND inverter circuit for the non-standard input signal.

4. The memory test mode circuit of claim 1 including:

a chip enable (CEX) input node for the integrated-circuit, wherein the chip enable (CEX) input node is coupled to another input signal node of the signal level detection circuit to enable the signal level detection circuit when a chip enable (CEX) signal on the chip enable (CEX) input node is TRUE.

5. The memory test mode circuit of claim 4 wherein the signal level detection 15 circuit is a 2NAND for the chip enable (CEX) signal.

6. The memory test mode circuit of claim 1 including a delay circuit serially coupled to the output terminal of the signal level detection circuit to require the input signal to have a predetermined minimum time duration.

7. The memory test mode circuit of claim 1 wherein the signal level detection circuit has another input signal terminal which is connected to another one of the input terminals of the integrated circuit and at which is provided an input signal which has an other non-standard logic level that is less than or equal to Vcc and that is greater than or equal to Vss, which other non-standard signal level is also detected by the signal level detection circuit to provide a second test mode output control signal that is combined with the test mode output control signal to provide a combined test mode output control signal at an output terminal of the signal level detection circuit for putting the integrated-circuit into a predetermined test mode.

8. The memory test mode circuit of claim 7 wherein the other non-standard logic level is close to a Vcc level.

9. The memory test mode circuit of claim 7 wherein the other non-standard logic level is close to a Vss level.

10. The memory test mode circuit of claim 1 wherein a trip level for detection of the non-standard signal level is set by adjustment of a width to length ratio (W/L) for a PMOS and an NMOS transistor of a CMOS 2NAND circuit used as a level detector circuit.

* * * * *